United States Patent [19]

Grewe et al.

[11] Patent Number: 5,670,730

[45] Date of Patent: Sep. 23, 1997

[54] DATA PROTOCOL AND METHOD FOR SEGMENTING MEMORY FOR A MUSIC CHIP

[75] Inventors: Anthony James Grewe, Holmdel; Kevin Alan Shelby, Red Bank, both of N.J.

[73] Assignee: Lucent Technologies Inc., Murray Hill, N.J.

[21] Appl. No.: 447,321

[22] Filed: May 22, 1995

[51] Int. Cl.$^6$ ............................................. G10H 1/26
[52] U.S. Cl. ............................................................ 84/609
[58] Field of Search ..................... 84/601, 602, 609–614, 84/634–638, 477 R, 478; 369/49; 434/307 A, 308–313

[56] References Cited

U.S. PATENT DOCUMENTS

| | | | |
|---|---|---|---|
| 4,905,289 | 2/1990 | Micic et al. | |
| 4,960,031 | 10/1990 | Farrand | 84/609 |
| 5,245,600 | 9/1993 | Yamauchi et al. | 369/49 |
| 5,473,106 | 12/1995 | Miyashita et al. | 84/609 |
| 5,486,645 | 1/1996 | Suh et al. | 84/610 |
| 5,494,443 | 2/1996 | Nakai et al. | 84/609 X |
| 5,499,922 | 3/1996 | Umeda et al. | 84/610 X |
| 5,506,370 | 4/1996 | Nakai et al. | 84/637 |
| 5,518,408 | 5/1996 | Kawashima et al. | 84/609 X |

*Primary Examiner*—Stanley J. Witkowski

[57] ABSTRACT

A protocol for labeling various types of data contained in a music chip. The protocol includes a hierarchical arrangement of headers for storing information about selections on the chip and the method in which they were coded in the memory of the chip. A global header located at the very start of memory will specify information needed to successfully decode the content of the music chip. This will include, for example, the necessary bit rate, as well as information pertaining to a specific PAC (Perceptual Audio Coding) algorithm employed in recording audio on the chip. In addition to the global header, each chip will have a section of memory allocated to a table of contents. The table of contents will include information on play times, song titles, music category and artist. Individual track selections will be listed as part of the table of contents by individual headers. The individual header contains a music field to which a track belongs, for example, classical, jazz, country, rock, etc., an artist field, and an address field which pertains to the information for addressing each track selection. Information from the headers is self-registered or automatically downloaded when a chip is loaded into a player/juke box device. The concept of self-registering general information included within the headers allows a user to select by type of music, artist, etc. for music selections made over a period of time. In addition, the present invention provides a method for segmenting memory in an integrated circuit chip wherein the integrated circuit chip is adapted for use in an audio player and the memory has pre-recorded audio stored therein. The method includes the steps of storing in a global header parameters corresponding to encoding techniques used in storing the pre-recorded audio in memory and coding in at least one individual header data fields indicative of general description information for individual tracks of the pre-recorded audio.

35 Claims, 1 Drawing Sheet

DATA PROTOCOL AND METHOD FOR SEGMENTING MEMORY FOR A MUSIC CHIP

FIELD OF THE INVENTION

The present invention relates to a protocol for labeling various types of data contained in a music chip, and more particularly to a data protocol that contains a hierarchical arrangement of headers.

BACKGROUND OF THE INVENTION

A variety of recording media exist today for the storage of consumer directed pre-recorded music and other audio applications. These media include CD-ROM (Compact Disc Read Only Memory), DAT (Digital Audio Tape) and traditional magnetic cassette audio tape, just to name a few. Of the above technologies, the compact disc format has steadily increased in popularity and gained consumer approval due to the high sound quality of the digitally stored audio, as well as ease of use.

Compact discs and other formats, however, have some significant disadvantages. For one, compact discs do not normally include the ability to register the content of the information stored on disc prior to selection at the player. In other words, in order to gain any information regarding the contents of a particular music selection, that selection will first have to be manually selected at the player. In the alternative, some CD players may be manually programmed to play certain selections based upon user input. In either circumstance, however, there is no way to automatically search and play music by category, for example, by mist, music type, etc., unless a user has prior knowledge with regard to the selection. Such knowledge must include at a minimum the precise location of a selection on the recording medium, a way in which to direct the player apparatus to that location, and a searchable index keyed to the selection and the locations. Largely because of limitations in the recording medium, many of these functions cannot be accomplished cost effectively or efficiently. It is therefore an object of the present invention, to provide a storage format for pre-recorded music that is easily selectable by a user in regard to general content.

SUMMARY OF THE INVENTION

The present invention is a protocol for labeling various types of data contained in a music chip. The data protocol includes a hierarchical arrangement of headers for storing information about selections on the chip and the method in which they were coded in the memory of the chip. A global header located at the very start of memory will specify information needed to successfully decode the content of the music chip. This will include, for example, the necessary bit rate, as well as information pertaining to the specific encoding algorithm employed in recording audio on the chip.

In addition to the global header, each chip will have a section of memory allocated to a table of contents. The table of contents will include information on play times, song titles, music category and artist. Individual track selections will be listed as part of the table of contents by individual headers. The individual header contains a music category to which a track belongs, for example, classical, jazz, country, rock, etc., the artist, and information for addressing each track selection. Information from the headers is self-registered or automatically downloaded when a chip is loaded into a player/juke box device. The concept of self-registering general information included within the headers allows a user to make selections by type of music, mist, etc. which is to be played over a period of time.

BRIEF DESCRIPTION OF THE FIGURES

For a better understanding of the present invention, reference may be had to the following description of exemplary embodiments thereof, considered in conjunction with the accompanying drawings, in which.

DETAILED DESCRIPTION OF THE DRAWINGS

Figure 1:
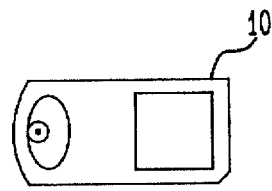
FIG. 1 shows a top plan view of one preferred embodiment of a music chip used in connection with the present invention data protocol.

Referring to FIG. 1, there is shown one preferred embodiment of a music chip 10, for use with the present invention data protocol. The music chip 10 is essentially a memory component which is adapted to be received into an accompanying solid state audio player for playing music contained on the chip. The physical characteristics of the chip 10 are that of a device of approximately 2.5"×1.125"×0.25" and made of a rugged ABS plastic (acrylic butyl styrene) or other like material. The relatively modest sized music chip device will have significant advantages over compact discs and other media with regard to transportability and storage. Memory and interface circuitry of the music chip 10 are embedded within the package. The memory of the music chip 10 contains prerecorded music or other like audio material stored in a compressed digital format.

Figure 2:
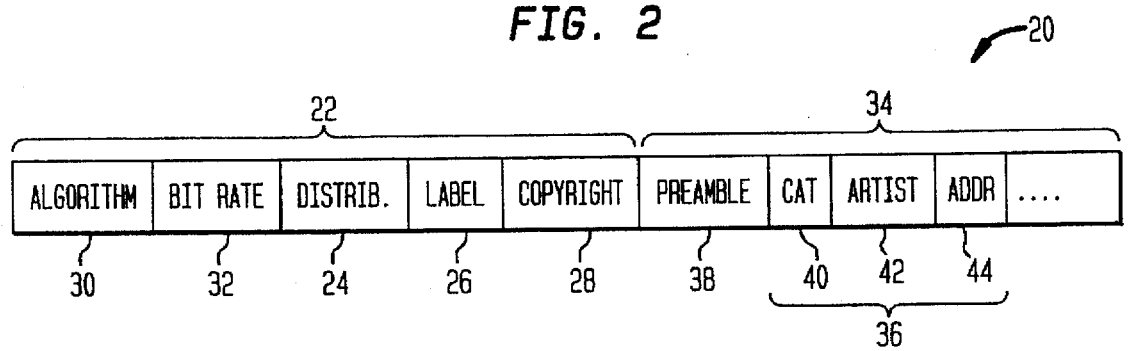
FIG. 2 shows one preferred embodiment of the present invention data protocol utilizing a hierarchical arrangement of headers.

Referring to FIG. 2, there is shown one preferred representation for the present invention memory configuration and format of a data protocol 20 used with the music chip 10. The data protocol 20 is essentially a standardized format for obtaining addressing and music selection information stored on the music chip 10. Each music chip 10 is encoded with a global header 22 at a starting address of memory, presumably at address 0×0. The global header 22 contains general information about selections on the chip and the method in which they were coded, among other things. More specifically, the global header 22 will contain the distributor of the music 24, record label 26 and perhaps copyright information 28. This information will be displayable (and/or audible) on a display device associated with the audio player. Also contained in the global header 22 will be parameter information that specifies the manner in which the music found on the music chip 10 was encoded, i.e., the specific encoding algorithm 30 employed.

The parameter information of the global header 22 is advantageously included because as compression technology evolves, it may be possible to encode more on a single chip using different algorithms, and almost certainly at different bit rates. Thus, rather than "freeze" the compression algorithm to its current quality using a specific bit rate, it will be more cost effective to generate a specific algorithm release for each chip. This would allow an album from a specific artist introduced today to use 128 Kbps while an album released at some future date from the same artist could utilize a different algorithm that would play at perhaps 32 Kbps with the same quality that the 128 Kbps piece has at present.

The global header 22, thus, will also specify the the necessary information pertaining to algorithm 30 and which can be a PAC (Perceptual Audio Coding) algorithm and bit rate 32 needed to successfully decode the contents of a music chip 10. By putting less than 12K of information, for example, into this particular section of the global header 22, the present invention avoids stranding the hardware associated with the music chip 10 to any particular software version. This versatility will allow the memory size for a given play length to be reduced over time, thus, providing a means to reduce the price per chip or increase margins.

As mentioned, the global header 22 contains information about the selections on the chip and the manner in which they were coded. This and other header information are accessed once upon power-up or insertion of the music chip into an associated audio player in order to determine the available track selection of the chip. Header information pertaining to each track is read subsequently in cueing up the chip and navigating between individual track selections.

In addition to the global header 22, each chip will have a section of memory therein allocated to what amounts to a table of contents 34. Track selections will be listed as part of this table of contents by individual headers 36. The table of contents 34 will include information on play times, song titles, music category and artist. The information contained in the table of contents 34 allows the chip contents to be self-registered, i.e., downloaded, upon insertion into an audio player/juke box device.

Referring once again to FIG. 2, an exemplary representation for the table of contents 34 including individual headers 36 is shown immediately following the global header 22. A preamble field 38 is shown preceding the individual headers 36, wherein the preamble may include play times and song titles as has been discussed. The preamble field 38 or global header 22 may also include other information as memory costs prove to be less restrictive. Examples of additional information which may be includable on the memory chip include graphics data corresponding to the prerecorded music, such as album artwork, and printed song lyrics, each of which may be viewed on a display device associated with the audio player. The display device may be a display window on the player or a display at a remotely viewable device, such as a remote control.

An individual header 36 is broken into sections and contains a category field 40, an artist field 42, and address field 44 for each track selection. The category field 40 designates a type of music associated with each individual track, for example, classical, jazz, country, rock, etc. The concept of storing specific track information within an individual header 36 allows a user to select music according to a categorized type of music, by artist, or combinations of both, as well as other criteria. For instance, a user may randomly select from the category of country western songs to be played over the course of an evening. On the other hand, the user could also request to hear songs from a specific mist, for example, Billy Joel.

The category field 40 (CAT) of the individual header 36 will correspond to a standardized numbering scheme for types of music. The category field 40 includes a fixed field of predetermined length having some reasonable limit—for example, a field of eight binary encoded bits corresponding to 256 possible categories. Examples of three letter abbreviations and corresponding category numbers for some standard music types are as follows: Classical (CLS=0); Country (CTY=1); Gospel (GOS=2); Jazz (JAZ=3); Popular (POP=4); Rap (RAP=5); Reggae (REG=6); Rhythm and Blues (RNB=7); and Rock (ROC=8). The list will, of course, be further developed to include various recognized music types.

The specification of bit assignments to each music type is intended to be standardized and periodically reviewed to accommodate new music types. Specification of the category field 40 and bit assignments therefor would most likely include input from music distributors, as well as the audio player hardware manufacturers.

Also included within the individual header 36 is the artist field 42, which may be encoded in one of two different ways. In a first technique, a unique bit assignment would be given to each recognized artist in a similar manner to the assignment of category field 40. This method, however, will necessitate an extremely large field in order to include an almost boundless list of musical artists. In addition, this coding technique will present a formidable challenge in keeping the artist encodings up to date as new artists emerge.

A second approach, which is perhaps more efficient, is to implement a procedure for abbreviating an artist's name and then encode each character of the abbreviation. As an example, an abbreviation for the artist Whitney Houston might be encoded as follows:

EX: Whitney Houston → WHOUST = 23/8/15/21/19/20
where alphabetic codes are represented as $\{a = 1, b = 2, c = 3, \ldots, z = 26\}$ Thus, each alphabetic character would be assigned a corresponding numeric code, wherein artist names would be abbreviated up to a predetermined number of characters. The intent here is not to convey an absolute representation of the artist's name, but to provide a field that can be scanned quickly to identify selections from a particular artist with low probability of falsely selecting a track from another artist.

This kind of encoding scheme, wherein the artist's name or identity is somehow abbreviated lends itself to arithmetic coding techniques used for text compression. Arithmetic coding, however, requires a global database of possible artists to get the highest efficiency in bit assignments and also results in non-uniform word fields. For this reason, arithmetic coding utilizing non-uniform word fields may be undesirable, since implementation thereof is contrary to the concept of fixed field widths. Non-arithmetically coded abbreviations, however, may be implementable utilizing a fixed field of sufficient length to accommodate abbreviations for any of the artists.

Figure 3:
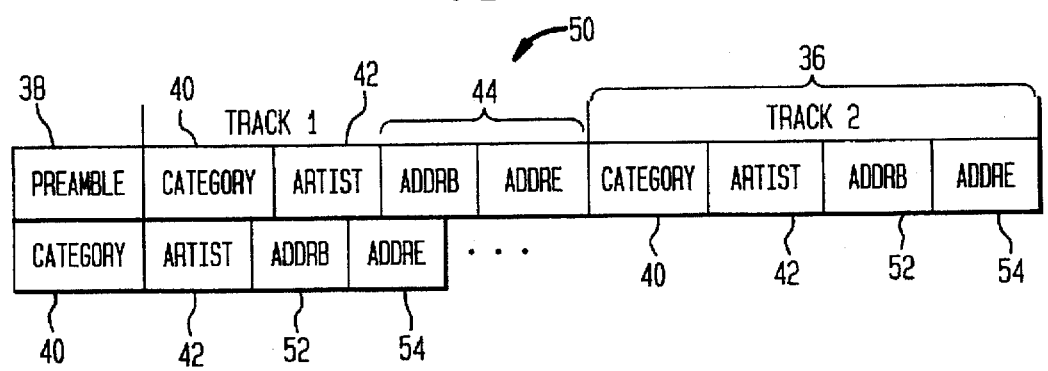
FIG. 3 shows one preferred implementation of an addressing scheme contained within individual headers.

As mentioned, an address field 44 is included as another section of the individual header 36. Two possible encoding schemes are contemplated for the address field 44. Referring to FIG. 3, there is shown a first address encoding scheme 50 for indicating track addresses of a music selection. FIG. 3 shows the preamble field 38, as well as category and artist fields 40, 42. Addressing is accomplished by explicitly specifying a begin address (ADDRB) 52 and an end address (ADDRE) 54 for each track. These addresses are read from the individual header 36 information at the start of each track. Decoding of this first address encoding scheme 50 begins with ADDRB 52 and proceeds until ADDRE 54 is reached, at which time a new track is selected. The remainder of the memory in the music chip 10 following the global header 22 and individual header 36 information will contain the actual encoded music which is stored utilizing a suitable PAC (Perceptual Audio Coding) algorithm.

Figure 4:
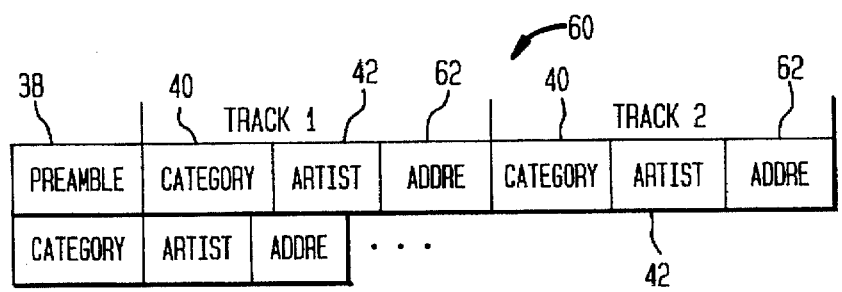
FIG. 4 shows another preferred implementation of an addressing scheme contained within the individual headers.

Referring to FIG. 4, a second address encoding scheme 60 is represented. As with the first approach shown in FIG. 3, the instant scheme utilizes the preamble field 38, and includes an individual header 36 with category and artist field 40, 42, respectively. An end address 62 is specified following the artist field 42. The second address endcoding scheme 60 relies more heavily on predefined, fixed width header fields and eliminates the need to specify both begin and end addresses (only one of which is supplied). Advantageously, this is more efficient in terms of storage requirements and accessing time, since only one address need be accessed for each track. By utilizing fixed field widths, the encoded music data corresponding to Track 1 of a music chip is known to begin at the end of the complete header information, i.e., global header 22+ preamble field 38+ individual headers 36. Thus, the address field for Track 1 need only specify the end address 62, since the begin address is already known or implied. A begin address for subsequent tracks is computed as the end address 62 of the preceding track on the chip, plus one address location, i.e., one more than the end address of the preceding track.

If a random play feature of tracks is desired, this can be achieved by indexing to the address field of the appropriate header 36 of a preceding track and adding one to recover a begin address for the desired track. The address field for the last track on a music chip 10 will be encoded with an "End-of-ROM" indicator in order to signify that no music content exists beyond that selection.

It will of course be understood, that the address field of the present embodiment encoding scheme can also be equivalently encoded as the begin address of the next track, wherein the end address of the present track is implied. This approach is somewhat less intuitive than providing an end address 62, as previously discussed, in that the address information contained in a specific header does not explicitly pertain to the track in which it is encoded.

The present invention data protocol for a music chip 10 enables general information regarding specific music selections to be quickly and easily accessed. In a preferred embodiment of the invention, the headers, i.e., global and individual are encoded with fixed field widths to eliminate the need for explicitly numbering each track, The header information for a track, n, can then be accessed at the following address:

[global header width]+[(n−1)(individual header width)]

where n=Track 1, . . . , Track N.

By supplying general information regarding the contents of a music chip 10 within a hierarchical arrangement of global and individual headers, 22 and 36 respectively this general information can be easily downloaded to a jukebox or home player, wherein a user may access that information without having to manually program any hardware. Music selections are then easily accomplished on the basis of artist, type of music, or combinations of both, thus allowing for increased flexibility in the making of single or multiple music selections.

Of course a significant concern in the implementation of the present invention data protocol hierarchical header arrangement is the mount of memory space on the music chip 10 which is lost in providing space for the headers. At present the standard music chip 10 includes in excess of 20 M-bytes of Read Only Memory (ROM). Employing the encoding algorithm at present day processing speeds, this translates to approximately 45 minutes of usable playing time per chip. At an average of 3 minutes per track, a music chip can accommodate approximately 15 or more tracks. The memory required for storage of the 15 accompanying headers for each of the tracks is envisioned to be significantly less than 1% of the memory capacity of the music chip 10. Accordingly, the required memory space for storage of the header arrangement will not adversely affect the overall storage capacity of the music chip 10, and will at the same time provide enhanced selectivity for the user.

From the above, it should be understood that the embodiments described, in regard to the drawings, are merely exemplary and that a person skilled in the art may make variations and modifications to the shown embodiments without departing from the spirit and scope of the invention. All such variations and modifications are intended to be included within the scope of the invention as defined in the appended claims.

What is claimed is:

1. A data format for use in an audio system wherein pre-recorded music is digitally encoded in memory of an integrated circuit music chip, and said music is decoded and reproduced by means of an associated audio player, said data format for storing information pertaining to the contents of said music chip, wherein individual tracks of audio are stored in designated locations in said music chip, said data format including:
   first header having parameters stored therein for use by said audio player in decoding said digitally encoded music stored in said memory; and
   at least one second header, said second header including selectable categorical information relating to said individual tracks of audio stored in said memory.

2. The data format of claim 1, wherein said first header includes a bit rate used for decoding said contents of said memory.

3. The data format of claim 1, wherein said first header specifies an algorithm used to encode said contents of said memory.

4. The data format of claim 1, wherein said second header includes a data field designating a category of music corresponding to one of said individual tracks of audio stored on said music chip.

5. The data format of claim 1, wherein said second header includes a data field having stored therein a code representative of an artist, said artist having a work included as a corresponding one of said individual tracks of audio.

6. The data format of claim 1, wherein said second header includes addressing information corresponding to said individual tracks of audio.

7. The data format of claim 6, wherein said addressing information includes a begin and end address for each of said individual tracks of audio.

8. The data format of claim 6, wherein said second header includes data fields of fixed widths, and wherein said addressing information includes only an end address for each of said individual tracks of audio, whereby a corresponding begin address is implied.

9. The data format of claim 1, wherein said first header includes data pertaining to distribution of said pre-recorded music.

10. The data format of claim 5, wherein said code representative of said artist includes a binary coded abbreviation of said artist.

11. The data format of claim 4, wherein said category code includes a binary code corresponding to a specific music type.

12. The data format of claim 1, wherein said at least one second header includes a data field corresponding to song titles and play times.

13. The data format of claim 4, wherein said music categories are selected from the group consisting of Classical (CLS); Country (CTY); Gospel (GOS); Jazz (JAZ), Popular (POP); Rap (RAP); Reggae (REG); Rhythm and Blues (RNB); and Rock (ROC).

14. The data format of claim 1, wherein information included in said first and second header is automatically downloadable from said music chip upon power-up.

15. The data format of claim 1, wherein said at least one second header follows said first header and said second header includes a data field designating a music category followed by a data field designating a musical artist followed by a data field designating addressing information for a corresponding one of said individual tracks of audio.

16. The data format of claim 15, wherein said addressing information includes a begin and end address for each of said individual tracks of audio.

17. The data format of claim 15, wherein said second header includes data fields of fixed widths, and wherein said addressing information includes only an end address for each of said individual tracks of audio, whereby a corresponding begin address is implied.

18. A data protocol for use in storing pre-recorded audio in memory of an integrated circuit chip, said integrated circuit chip being adapted for use with an audio player, said data protocol comprising:

global header having parameters stored therein corresponding to an encoding technique used for storing said pre-recorded audio in memory and used by said audio player in decoding said audio; and at least one individual header having multiple data fields, said data fields including general description information about individual tracks of said pre-recorded audio.

19. The data protocol of claim 18, wherein said global header specifies a bit rate to be used in decoding said pre-recorded audio stored in memory.

20. The data protocol of claim 18, wherein said individual header includes a data field indicative of a music category for an associated track of audio.

21. The data protocol of claim 18, wherein said individual header includes a data field representative of an artist associated with said individual track.

22. The data protocol of claim 18, wherein said individual header includes addressing information for an associated one of said individual tracks.

23. The data protocol of claim 22, wherein said addressing information includes only an end address and wherein a begin address is implied.

24. The data protocol of claim 18, wherein said global header and said individual header are self-registered upon said integrated circuit chip being powered in said audio player.

25. The data protocol of claim 18, wherein said pre-recorded audio is encoded in memory immediately following said at least one individual header.

26. The data protocol of claim 18, wherein said at least one individual header follows said global header and said individual header includes a data field designating a music category followed by a data field designating a musical artist followed by a data field designating addressing information for a corresponding one of said individual tracks of audio.

27. The data protocol of claim 18, wherein said individual header includes a preamble including displayable information pertaining to song titles and play times therefor.

28. The data protocol of claim 18, wherein said individual header includes a preamble including displayable graphics relating to said prerecorded audio.

29. The data protocol of claim 18, wherein said individual header includes displayable song lyrics.

30. The data protocol of claim 26, wherein said global header includes a bit rate used for decoding said prerecorded music, along with displayable record label and copyright information.

31. A method of segmenting memory in an integrated circuit chip, said integrated circuit chip adapted for use in an audio player and said memory having pre-recorded audio stored therein, said method comprising the steps of:

storing in a global header parameters corresponding to encoding techniques used in storing said pre-recorded audio in memory; and coding in at least one individual header data fields indicative of general description information for individual tracks of said pre-recorded audio.

32. The method of claim 31, further including the step of specifying in said global header a bit rate to be used in decoding said pre-recorded audio stored in memory.

33. The method of claim 31, wherein said individual header includes a data field indicative of a music category for an associated track of audio.

34. The method of claim 31, wherein said individual header includes a data field representative of an artist associated with one of said individual tracks.

35. The method of claim 31, wherein said individual header includes addressing information for an associated one of said individual tracks.

* * * * *

(12) EX PARTE REEXAMINATION CERTIFICATE (8904th)
United States Patent
Grewe et al.

(10) Number: US 5,670,730 C1
(45) Certificate Issued: Mar. 20, 2012

(54) DATA PROTOCOL AND METHOD FOR SEGMENTING MEMORY FOR A MUSIC CHIP

(75) Inventors: Anthony James Grewe, Holmdel, NJ (US); Kevin Alan Shelby, Red Bank, NJ (US)

(73) Assignee: Agere Systems, Inc., Allentown, PA (US)

Reexamination Request:
No. 90/011,659, Apr. 26, 2011

Reexamination Certificate for:
Patent No.: 5,670,730
Issued: Sep. 23, 1997
Appl. No.: 08/447,321
Filed: May 22, 1995

(51) Int. Cl.
*G10H 1/00* (2006.01)
*G11C 7/00* (2006.01)
*G11C 5/00* (2006.01)
*G11C 7/16* (2006.01)

(52) U.S. Cl. .......................................................... 84/609
(58) Field of Classification Search ...................... 84/609
See application file for complete search history.

(56) References Cited

To view the complete listing of prior art documents cited during the proceeding for Reexamination Control Number 90/011,659, please refer to the USPTO's public Patent Application Information Retrieval (PAIR) system under the Display References tab.

*Primary Examiner* — Deandra M. Hughes

(57) ABSTRACT

A protocol for labeling various types of data contained in a music chip. The protocol includes a hierarchical arrangement of headers for storing information about selections on the chip and the method in which they were coded in the memory of the chip. A global header located at the very start of memory will specify information needed to successfully decode the content of the music chip. This will include, for example, the necessary bit rate, as well as information pertaining to a specific PAC (Perceptual Audio Coding) algorithm employed in recording audio on the chip. In addition to the global header, each chip will have a section of memory allocated to a table of contents. The table of contents will include information on play times, song titles, music category and artist. Individual track selections will be listed as part of the table of contents by individual headers. The individual header contains a music field to which a track belongs, for example, classical, jazz, country, rock, etc., an artist field, and an address field which pertains to the information for addressing each track selection. Information from the headers is self-registered or automatically downloaded when a chip is loaded into a player/juke box device. The concept of self-registering general information included within the headers allows a user to select by type of music, artist, etc. for music selections made over a period of time. In addition, the present invention provides a method for segmenting memory in an integrated circuit chip wherein the integrated circuit chip is adapted for use in an audio player and the memory has pre-recorded audio stored therein. The method includes the steps of storing in a global header parameters corresponding to encoding techniques used in storing the pre-recorded audio in memory and coding in at least one individual header data fields indicative of general description information for individual tracks of the prerecorded audio.

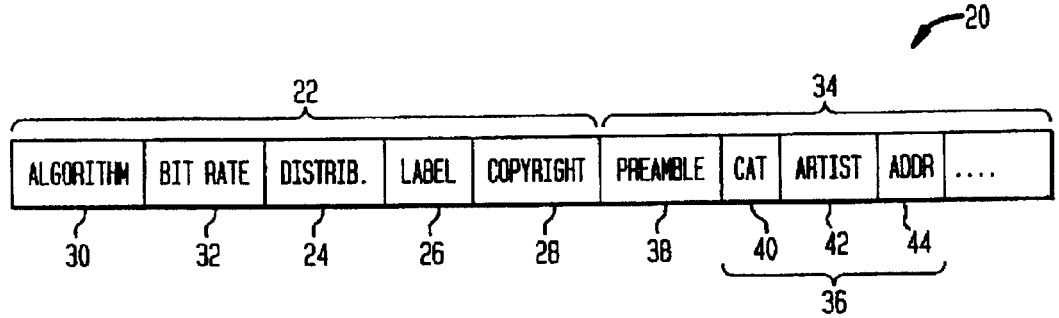

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1-6 and 12-13 is confirmed.

Claims 7-11 and 14-35 were not reexamined.

* * * * *